US012598718B2

(12) United States Patent
Moody

(10) Patent No.: US 12,598,718 B2
(45) Date of Patent: Apr. 7, 2026

(54) ANALOG CONVERTER BOX MOUNTING STRUCTURE

(71) Applicant: Toyota Motor Engineering & Manufacturing North America, Inc., Plano, TX (US)

(72) Inventor: Nicholas Scott Moody, Westland, MI (US)

(73) Assignees: Toyota Motor Engineering & Manufacturing North America, Inc., Plano, TX (US); Toyota Jidosha Kabushiki Kaisha, Toyota (JP)

( * ) Notice: Subject to any disclaimer, the term of this patent is extended or adjusted under 35 U.S.C. 154(b) by 24 days.

(21) Appl. No.: 18/190,270

(22) Filed: Mar. 27, 2023

(65) Prior Publication Data

US 2024/0334633 A1 Oct. 3, 2024

(51) Int. Cl.
H05K 7/02 (2006.01)

(52) U.S. Cl.
CPC ..................................... H05K 7/02 (2013.01)

(58) Field of Classification Search
CPC .......... H05K 7/02; F16M 13/02; H02G 3/081; H02G 3/08
USPC .......... 248/670, 671, 673, 675, 201, 346.03, 248/346.07, 310, 682, 448, 450, 449, 451, 248/906, 311.2, 316.8, 314, 316.1
See application file for complete search history.

(56) References Cited

U.S. PATENT DOCUMENTS

| | | | | |
|---|---|---|---|---|
| 4,458,874 A | * | 7/1984 | Rabas | A47F 7/024 |
| | | | | 248/448 |
| 7,789,318 B2 | * | 9/2010 | Tokell | F02G 1/043 |
| | | | | 248/231.91 |
| 7,837,156 B1 | * | 11/2010 | Handler | F16L 3/1218 |
| | | | | 248/339 |
| 11,415,264 B2 | * | 8/2022 | Bullock | H05K 5/0204 |
| 2004/0181938 A1 | * | 9/2004 | Suzuki | H01L 21/67294 |
| | | | | 29/721 |
| 2012/0126085 A1 | * | 5/2012 | Johnson | A47C 7/002 |
| | | | | 248/346.03 |
| 2018/0229312 A1 | * | 8/2018 | Maynard | B23B 5/36 |

(Continued)

FOREIGN PATENT DOCUMENTS

CN        203176688 U   *   9/2013

OTHER PUBLICATIONS https://www.amazon.de/-/en/Digital-Modulator-Converter-Portable-110-240V/dp/B08JQH3694; Amazon, 2 pages, Sep. 22, 2020 (Year: 2020).*

(Continued)

*Primary Examiner* — Kimberly T Wood
(74) *Attorney, Agent, or Firm* — Christopher G. Darrow; Darrow Mustafa PC

(57) ABSTRACT

A mounting structure for an analog converter box includes a mounting block having a base portion, a block first side wall extending from the base portion, an end wall intersecting the base portion and the block first side wall, and a block first front wall extending from the end wall and the block first side wall so as to overhang a portion of the base portion. The base portion, the block first side wall, the end wall and the block first front wall combine to define a block first pocket structured to receive a portion of the converter box therein. The converter box can be secured to a mounting surface in either of two, orthogonally-related orientations, for the convenience of a user and/or to facilitate testing operations.

7 Claims, 5 Drawing Sheets

(56)                    References Cited

U.S. PATENT DOCUMENTS

2020/0315042  A1*  10/2020  Bullock ................. F16M 13/02
2022/0278399  A1*   9/2022  Ohta ................... H01M 50/184

OTHER PUBLICATIONS

Canford, "Canford Line Isolating Units—Analogue—Rack mount-
ing", Retrieved from the Internet: <https://www.canford.co.uk/
CANFORD-LINE-ISOLATING-UNITS-Analogue-Rack-mount-
ing>, retrieved Mar. 14, 2023 (1 page).
37South, "XIO-006 (4 × Analog Inputs)", Retrieved from the
Internet: <https://37s.com.au/accessories/actual-catalog/xio-006/>,
retrieved Mar. 14, 2023 (2 pages).
LI-COR, "LI-7700 | Analog inputs (LI-7700)", Retrieved from the
Internet: <https://www.licor.com/env/support/LI-7700/topics/analog-
inputs.html>, retrieved Mar. 14, 2023 (5 pages).

* cited by examiner

ANALOG CONVERTER BOX MOUNTING STRUCTURE

TECHNICAL FIELD

The present invention relates to structures for mounting or securing testing apparatus and, more particularly, to a mounting structure for securing an analog converter box to a mounting surface during testing.

BACKGROUND

It is frequently necessary to secure an analog converter box to a mounting surface for use in on-road vehicle testing procedures. The converter box must be secured to a mounting surface so as to be immobilized, so that wires can be plugged into (and extracted from) various ports and terminals of the converter box by a user.
Immobilization of the converter box is necessary to avoid damage to equipment and/or personnel during a vehicle collision.

It is often most expedient to use disposable attachment mechanisms (such as Velcro or tie-wraps) to mount the converter box to the mounting surface. It is also frequently necessary to reposition and/or re-orient the converter box during performance of various test procedures. However, with repeated use, Velcro strips loosen and detach from the surfaces to which they are affixed, and the cutting of tie-wraps to reposition the converter box generates a large amount of plastic waste over time.

SUMMARY

In one aspect of the embodiments described herein, a mounting structure for an analog converter box is provided. The structure includes a mounting block having a base portion, a block first side wall extending from the base portion, an end wall intersecting the base portion and the block first side wall, and a block first front wall extending from the end wall and the block first side wall so as to overhang a portion of the base portion. The base portion, the block first side wall, the end wall and the block first front wall combine to define a block first pocket structured to receive a portion of the converter box therein.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale. Also, unless otherwise stated or shown, the same or similar elements shown in different views may be given the same or similar reference numerals or designations.

DETAILED DESCRIPTION

A mounting structure for an analog converter box includes pair of opposable mounting blocks, with each mounting block structured to receive and secure therein an associated end of the converter box. Each block defines a pair of pockets, with each pocket being structured to receive and secure a corner of the converter box therein. When the mounting blocks are secured to a surface (such as a peg board or a rail) in a testing environment and an associated portion of the converter box is received in the pocket, the portion of the converter box is held in a desired position so that the converter box can be used for test purposes. The converter box can be secured to a mounting surface in either of two, orthogonally-related orientations, for the convenience of a user and/or to facilitate testing operations.

Figure 1:
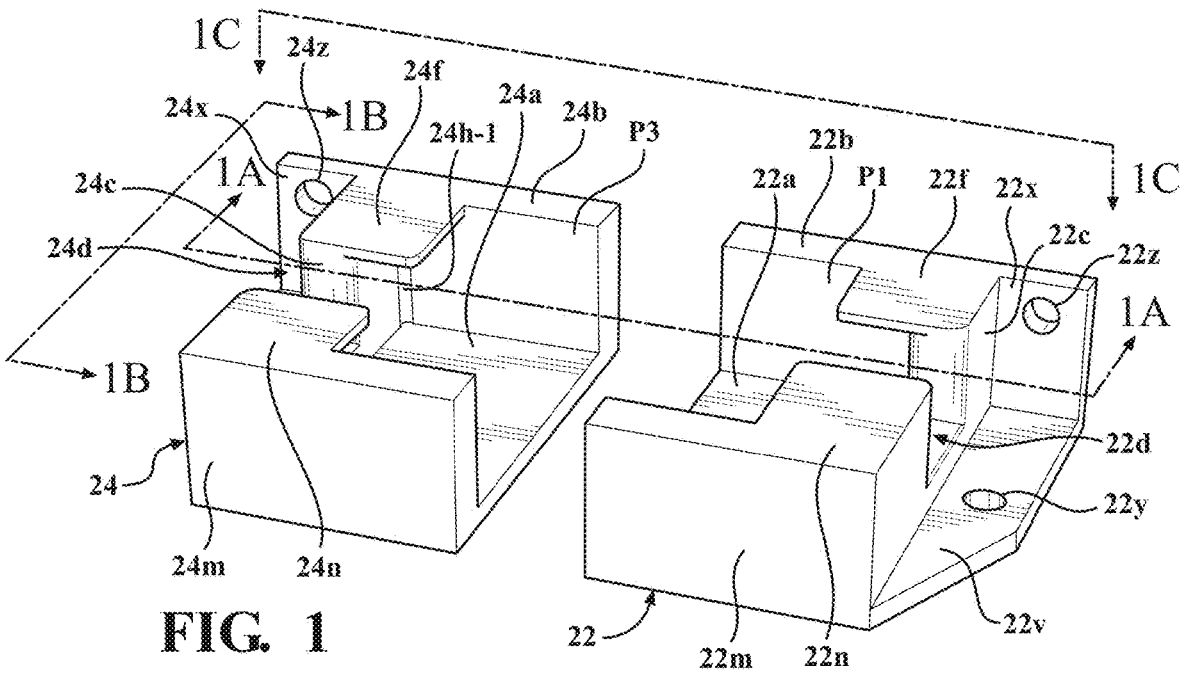
FIG. 1 is a schematic perspective view of a mounting structure for an analog converter box in accordance with an embodiment described herein.
Figure 1A:
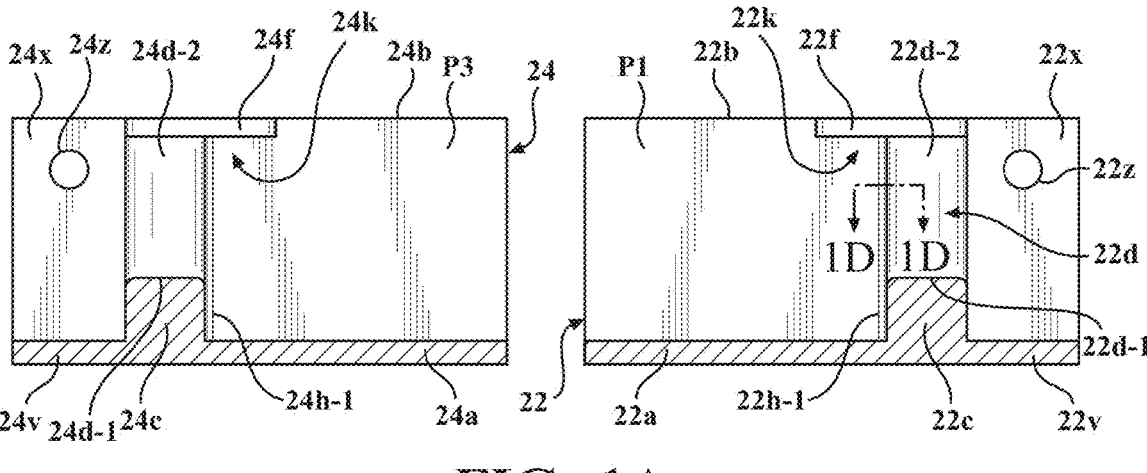
FIG. 1A is a schematic cross-sectional side view of the mounting structure shown in FIG. 1.
Figure 1B:
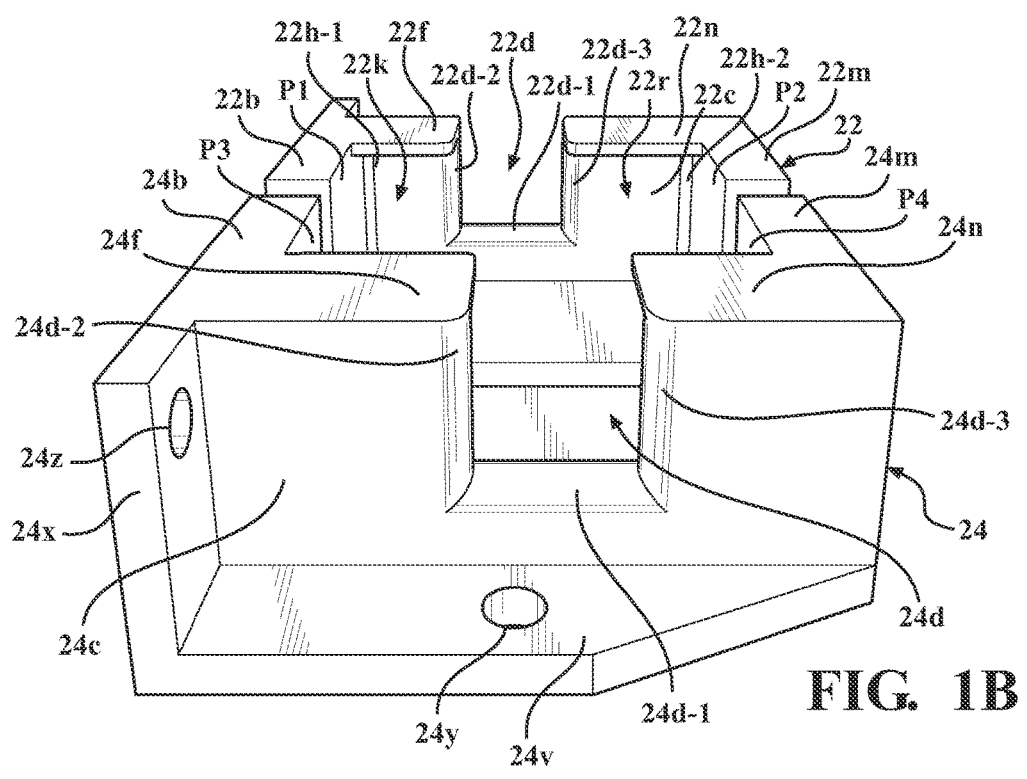
FIG. 1B is schematic end perspective view of the mounting structure shown in FIG. 1.
Figure 2:
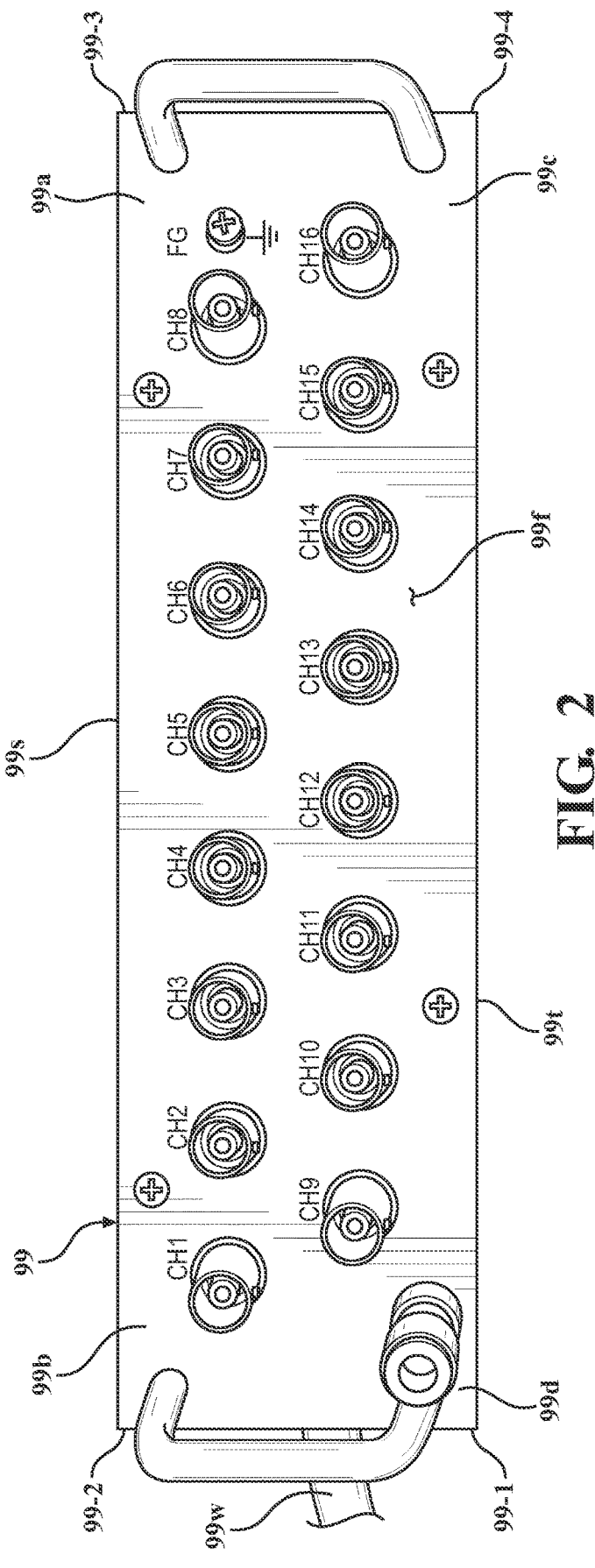
FIG. 2 is a schematic front view of an exemplary analog converter box mountable in an embodiment of a mounting structure described herein.

FIG. 1 is a schematic perspective view of a mounting structure for an analog converter box in accordance with an embodiment described herein. FIG. 1A is a schematic cross-sectional side view of the mounting block 22 shown in FIG. 1. FIG. 2 is a schematic front view of an exemplary analog converter box mountable in an embodiment of a mounting structure described herein. Referring to FIGS. 1 and 1A, in one or more arrangements, the mounting structure 20 may include a mounting block 22. The mounting block 22 may have a base portion 22a and a block first side wall 22b extending from the base portion 22a. In one or more arrangements, the block first side wall 22b may define a flat first plane P1. In one or more arrangements, the block first side wall 22b may extend perpendicular to the base portion 22a. An end wall may 22c intersect the base portion 22a and the block first side wall 22b. The end wall 22c may extend perpendicular to the base portion 22a and the block first side wall 22b.

A block first front wall 22f may extend from the end wall 22c and the block first side wall 22b so as to overhang a portion of the base portion 22a. The base portion 22a, the block first side wall 22b, the end wall 22c and the block first front wall 22f may combine to define a block first pocket 22k structured to receive an associated portion of the converter box 99 therein. For a converter box 99 having a rectangular box shape as shown in FIG. 2, the portion of the converter box received in the first pocket may be an exterior corner of the converter box. Each exterior corner may be an intersection of two flat, exterior sides of the box, such as exterior corners 99-1 and 99-2 shown in FIG. 2.

Figure 1C:
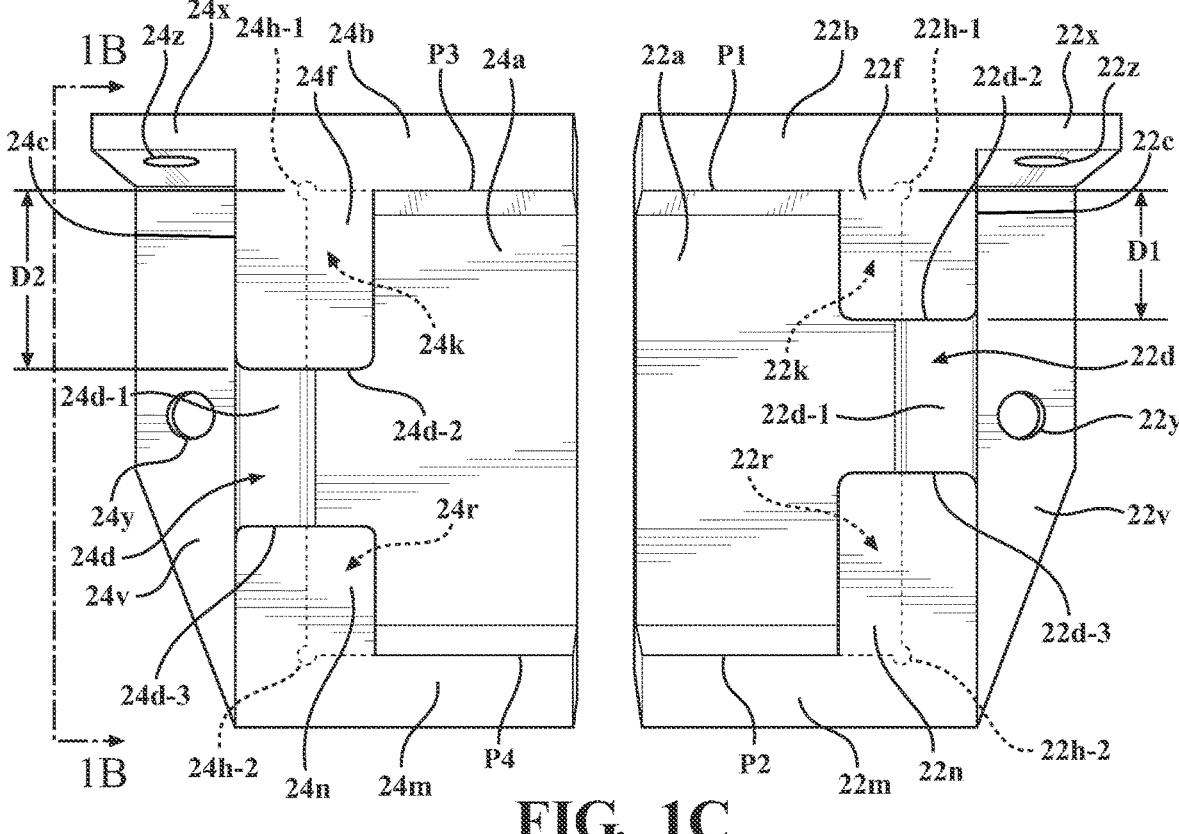
FIG. 1C is schematic plan perspective view of the mounting structure shown in FIG. 1.

FIG. 1C is schematic plan perspective view of the mounting structure shown in FIG. 1. Referring to FIGS. 1 and 1A-1C, the block end wall 22c may define a block window 22d. The block window 22d may have a first edge 22d-1 extending parallel to the base portion 22a. First edge 22d-1 may be spaced apart a first distance D1 from the plane P1 defined by the block first side wall 22*b*. The block window 22*d* may also have a second edge 22*d*-2 extending from the first edge 22*d*-1 to the block first front wall 22*f*, and a third edge 22*d*-3 extending from the first edge 22*d*-1 opposite the second edge 22*d*-2 to a block second front wall 22*n* (described in greater detail below). The block window 22*d* may provide a path for wires (such as wires 99*w* of FIG. 3) leaving the converter box to exit the mounting structure for electrical attachment to a power source, an instrument for processing digital output signals, or another device.

In one or more arrangements, because wires exiting the converter box may contact the edges of the window 22*d*, all of block window edges 22*d*-1, 22*d*-2, and 22*d*-3 may be curved (i.e., intersections between the edges and other surfaces of the block 22 may be radiused). Providing curved surfaces along the window edges avoids sharp corners which may tend to abrade or fray portions of the wires 99*w* passing through the window.

Figure 1D:
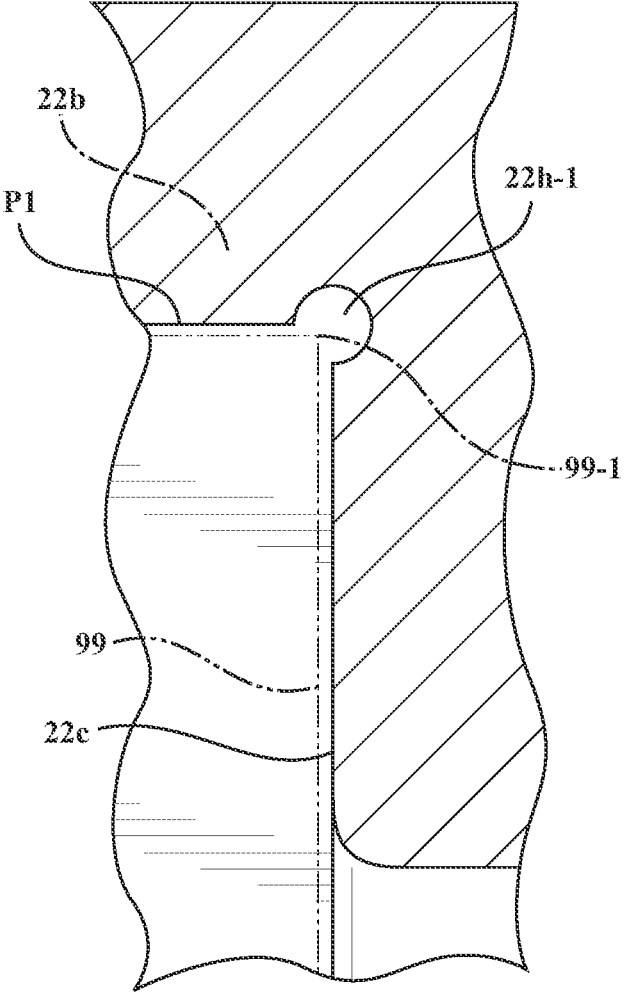
FIG. 1D is a schematic plan cross-sectional view of an exemplary recess formed at an intersection between a side wall and an end wall of a mounting block in accordance with an embodiment described herein.
Figure 3:
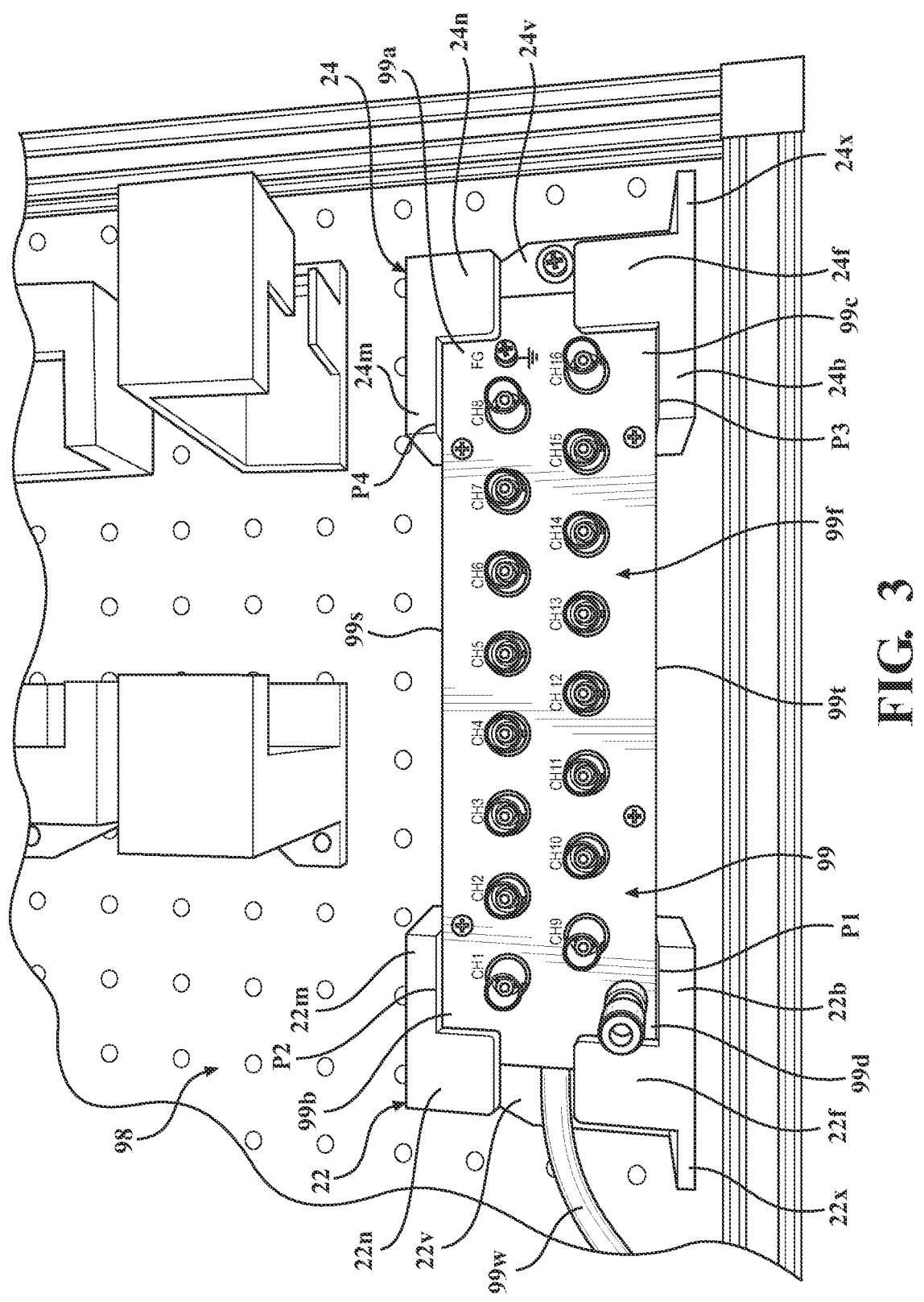
FIG. 3 is schematic front perspective view of the mounting structure shown in FIG. 1, showing an analog converter box mounted therein.

FIG. 1D is a schematic cross-sectional view of an exemplary recess 22*h*-1 formed at an intersection between a side wall (in this case, side wall 22*b*) and an end wall (in this case, end wall 22*c*. Referring to FIGS. 1-1D, a block first recess 22*h*-1 may extend along an intersection of the block first side wall 22*b* with the end wall 22*c*. The block first recess 22*h*-1 may be structured to receive therein a first corner of the portion of the converter box 99 when the portion of the converter box is received in the block first pocket 22*k*. For example, FIGS. 1D, 2, and 3 illustrate how a corner 99-1 of a converter box 99 (shown in phantom) may be received in recess 22*h*-1.

Similar recesses may be provided in each of the mounting block pockets described herein. These recesses may prevent corners of the converter box from abutting the intersections between the end walls and adjacent side walls, thereby helping to ensure that exterior sides 99*s*, 99*t* of the converter box 99 extending between the corners of the box rest flush against the planes P1, P2, P3, and P4 defined by the side walls 22*b*, 22*m*, 24*b*, and 24*m*, respectively, when the converter box is received in the mounting blocks 22, 24 as described herein.

Referring to the drawings, in one or more arrangements, the mounting block 22 may further include a block second side wall 22*m* extending from the base portion 22*a* opposite the block first side wall 22*b*. In one or more arrangements, the block second side wall 22*m* may define a flat second plane P2. In one or more arrangements, the block second side wall 22*m* may extend perpendicular to the base portion 22*a* and to the end wall 22*c*. Also, a block second front wall 22*n* may extend from the end wall 22*c* and the block second side wall 22*m* so as to overhang a portion of the base portion 22*a*. The base portion 22*a*, the block second side wall 22*m*, the end wall 22*c* and the block second front wall 22*n* may combine to define a block second pocket 22*r* structured to receive another associated portion of the converter box therein. In addition, a block second recess 22*h*-2 may extend along an intersection of the block second side wall 22*m* with the end wall 22*c*. Block second recess 22*h*-2 may be structured to receive therein a corner of another portion of the converter box when the other portion of the converter box is received in the second pocket 22*r*.

Mounting block 22 may also include a block first mounting flange 22*x* extending from the block first side wall 22*b*. Flange 22*x* may include a mounting hole 22*z*. Mounting block 22 may also include a block second mounting flange 22*v* extending from the block end wall 22*c* so as to orthogonally intersect the block first mounting flange 22*x*. Flange 22*v* may include a mounting hole 22*y*. Mounting flanges 22*x* and 22*v* may enable the mounting block 22 to be attached to a mounting surface in either of two orthogonally-related mounting orientations. More specifically, referring to FIG. 3, attachment of the blocks 22 and 24 to a surface 98 using mounting flanges 22*v* and 24*v*, respectively, enables the converter box 99 to be secured in position with respect to the surface 98 so that the converter box 99 faces in a direction perpendicular to the surface 98 (i.e., so that a face 99*f* of the converter box extends parallel to the surface 98). Similarly, attachment of the blocks 22 and 24 to the surface 98 using mounting flanges 22*x* and 24*x*, respectively, enables the converter box 99 to be secured in position with respect to the surface 98 so that the converter box 99 faces in a direction parallel to the surface 98 (i.e., so that the face 99*f* of the converter box extends perpendicular to the mounting surface 98).

Referring again to the drawings, the mounting structure 20 may also include another mounting block 24 separate from the mounting block 22. The other mounting block 24 may include another base portion 24*a* and another block first side wall 24*b* extending from the other base portion 24*a*. In one or more arrangements, the other block first side wall 24*b* may define another flat first plane P3. In one or more arrangements, the other block first side wall 24*b* may extend perpendicular to the base portion 24*a*. In addition, another end wall 24*c* may intersect the other base portion 24*a* and the other block first side wall 24*b*. The other end wall 24*c* may extend perpendicular to the other base portion 24*a* and the other block first side wall 24*b*.

Another block first front wall 24*f* may extend from the other end wall 24*c* and the other block first side wall 24*b* so as to overhang a portion of the other base portion 24*a*. In addition, the other base portion 24*a*, the other block first side wall 24*b*, the other end wall 24*c* and the other block first front wall 24*f* may combine to define another block first pocket 24*k* structured to receive an associated portion of the converter box 99 therein.

Referring again to FIGS. 1 and 1A-1C, the other end wall 24*c* may define another block window 24*d*. The other block window 24*d* may have another first edge 24*d*-1 extending parallel to the other base portion 24*a*. The other first edge 24*d*-1 may be spaced apart a second distance D2 from the plane P2 defined by the other block first side wall 24*b*. The other block window 22*d* may also have a second edge 24*d*-2 extending from the other block window first edge 24*d*-1 to the other block first front wall 24*f*, and a third edge 24*d*-3 extending from the first edge 24*d*-1 opposite the second edge 24*d*-2 to the other block second side wall 24*m* (described in greater detail below).

The other block window 24*d* may provide a path for wires leaving an end of the converter box 99. Similar to the previously-described block window 22*d*, because wires exiting the converter box 99 may contact the edges of window 24*d*, all of other block window edges 24*d*-1, 24*d*-2, and 24*d*-3 may be curved (i.e., intersections between the edges and other surfaces of the block 24 may be radiused).

In addition, in one or more arrangements, with the block end wall 22*c* spaced apart a first distance D1 from the block first side wall 22*b*, the other block end wall 24*c* may be structured so that the other block window first edge 24*d*-1 is spaced apart a second distance D2 from the other block first side wall 24*b*, and the second distance D2 may be greater than the first distance D1. This arrangement is designed to accommodate a situation where wires 99*w* exit the converter box at different distances from a given side (either side 99*s* or side 99*t*) of the converter box.

Referring to the drawings, in one or more arrangements, the other mounting block 24 may further include another block second side wall 24*m* extending from the base portion 24*a* opposite the other block first side wall 24*b*. In one or more arrangements, the other block second side wall 24*m* may define another block flat second plane P4. In one or more arrangements, the other block second side wall 24*m* may extend perpendicular to the other base portion 24*a* and to the other end wall 24*c*. In addition, another block second front wall 24*n* may extend from the other end wall 24*c* and the other block second side wall 24*m* so as to overhang a portion of the other base portion 24*a*. The other base portion 24*a*, the other block second side wall 24*m*, the other end wall 24*c* and the other block second front wall 24*n* may combine to define another block second pocket 24*r* structured to receive an associated portion of the converter box 99 therein.

Also, another block second recess 24*h*-2 may extend along an intersection of the other block second side wall 24*m* with the other end wall 24*c*. In a manner previously described, other block second recess 24*h*-2 may be structured to receive therein a corner of the converter box 99 when a portion of the converter box 99 is received in the other block second pocket 24*r*.

Referring to FIGS. 1C and 3, in one or more arrangements, the block 22 and the other block 24 may be structured so that the block flat first plane P1 and the other block flat first plane P3 are coplanar or substantially coplanar (within a tolerance range of ±0.05 inches inclusive) when the block 22 and the other block 24 are secured in converter-receiving positions with respect to each other. The block 22 and the other block 24 may be considered secured in converter-receiving positions with respect to each other when the blocks 22, 24 are fixed opposite each other as shown in FIG. 3, in positions where portions of the converter box 99 are received in the first and second pockets 22*k*, 22*r* of the block 22 and other portions of the converter box 99 are received in the first and second pockets 24*k*, 24*r* of the other block 24, with additional, unsupported portions of the converter box 99 extending between the block 22 and the other block 24 so that the converter box 99 is secured in a desired position by the block 22 and the other block 24.

In one or more arrangements, the block 22 and the other block 24 may be structured so that the block flat second plane P2 and the other block flat second plane P4 are coplanar or substantially coplanar (within a tolerance range of ±0.05 inches inclusive) when the block 22 and the other block 24 are secured in converter-receiving positions with respect to each other. Thus, for example, in the arrangement shown in FIG. 3, portion 99*a* of the converter box 99 is secured in other block second pocket 24*r*, portion 99*b* of the converter box 99 is secured in block second pocket 22*r*, portion 99*c* of the converter box 99 is secured in other block first pocket 24*k*, and portion 99*d* of the converter box 99 is secured in block first pocket 22*k*, to fix the converter box 99 in position in relation to the mounting surface 98 for operation. In addition, coplanar planes P2 and P4 cooperate to support side 99*s* of the converter box 99, and coplanar planes P1 and P3 cooperate to support side 99*t* of the converter box 99.

As described herein, when the mounting block 22 is secured to a surface (such as a peg board or a rail) in a testing environment and an associated portion of the converter box is received in the pocket, the portion of the converter box is held in a desired position so that the converter box can be used for test purposes.

In the above detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B and C" includes A only, B only, C only, or any combination thereof (e.g. AB, AC, BC or ABC).

Aspects herein can be embodied in other forms without departing from the spirit or essential attributes thereof. Accordingly, reference should be made to the following claims, rather than to the foregoing specification, as indicating the scope of the invention.

What is claimed is:

1. A mounting structure for an analog converter box, the mounting structure comprising:
    a mounting block having:
        a block first side wall defining a flat first plane; and
        a block window spaced apart a first distance from the flat first plane;
        an end wall intersecting the block first side wall;
        a block first pocket extending between the end wall and the block first side wall,
        the end wall intersecting the block first side wall along a block first recess extending into the end wall and the block first side wall in a direction away from the first pocket; and
    another mounting block separate from the mounting block and having:
        another block first side wall defining a another flat first plane; and
        another block window spaced apart a second distance from the another flat first plane,
    wherein the second distance is greater than the first distance when the mounting block and the another mounting block are positioned with respect to each other so that the flat first plane and the another flat first plane are coplanar, and wherein the end wall defines the block window.

2. The mounting structure of claim 1, wherein edges of the block window are curved.

3. The mounting structure of claim 1, wherein the mounting block further includes:
    a block second side wall extending opposite the block first side wall and intersecting the end wall; and
    a block second pocket extending between the end wall and the block second side wall,
    the end wall intersecting the block second side wall along a block second recess extending into the end wall and the block second side wall in a direction away from the block second pocket.

4. The mounting structure of claim 1, wherein the another mounting block includes:

another end wall intersecting the another block first side wall; and another block first pocket extending between the another end wall and the another block first side wall, the another end wall intersecting the another block first side wall along another block first recess extending into the another end wall and the another block first side wall in a direction away from the another block first pocket.

5. The mounting structure of claim 4, wherein the mounting block and the another mounting block are structured so that the flat first plane defined by the block first side wall and the another flat first plane defined by the another block first side wall are coplanar or substantially coplanar when the block and the another block are secured in converter box-receiving positions with respect to each other.

6. The mounting structure of claim 4, wherein the another mounting block further includes:

another block second side wall extending opposite the another block first side wall and intersecting the another end wall; and another block second pocket extending between the another end wall and the another block second side wall, the another end wall intersecting the another block second side wall along another block second recess extending into the another end wall and the another block second side wall in a direction away from the another block second pocket.

7. A mounting structure for an analog converter box, the mounting structure comprising:

a mounting block having:
  a block first side wall defining a flat first plane;
  a block window spaced apart a first distance from the flat first plane; and another mounting block separate from the mounting block and having:
  another block first side wall defining a another flat first plane;
  another block window spaced apart a second distance from the another flat first plane;
  another end wall intersecting the another block first side wall; and
  another block first pocket extending between the another end wall and the another block first side wall,
  the another end wall intersecting the another block first side wall along another block first recess extending into the another end wall and the another block first side wall in a direction away from the another block first pocket, wherein the second distance is greater than the first distance when the mounting block and the another mounting block are positioned with respect to each other so that the flat first plane and the another flat first plane are coplanar, and wherein the another end wall defines the another block window.

* * * * *